US010257934B2

(12) United States Patent
Mori et al.

(10) Patent No.: US 10,257,934 B2
(45) Date of Patent: Apr. 9, 2019

(54) CIRCUIT BOARD MODULE

(71) Applicant: SHINKO ELECTRIC INDUSTRIES CO., LTD., Nagano (JP)

(72) Inventors: Kenichi Mori, Nagano (JP); Kazuyuki Kubota, Nagano (JP); Yoshihiro Ihara, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 0 days.

(21) Appl. No.: 15/904,577

(22) Filed: Feb. 26, 2018

(65) Prior Publication Data

US 2018/0317321 A1 Nov. 1, 2018

(30) Foreign Application Priority Data

Apr. 28, 2017 (JP) ................................ 2017-090052

(51) Int. Cl.
*H05K 1/18* (2006.01)
*H05K 1/14* (2006.01)
(Continued)

(52) U.S. Cl.
CPC ........... *H05K 1/144* (2013.01); *H01R 12/725* (2013.01); *H01R 12/728* (2013.01); *H05K 1/111* (2013.01); *H05K 1/117* (2013.01); *H05K 1/181* (2013.01); *H01R 12/721* (2013.01); *H05K 1/0231* (2013.01); *H05K 1/113* (2013.01); *H05K 1/141* (2013.01); *H05K 1/183* (2013.01); *H05K 2201/042* (2013.01); *H05K 2201/09036* (2013.01); *H05K 2201/09045* (2013.01);
(Continued)

(58) Field of Classification Search
CPC .. H01R 12/721; H01R 12/725; H01R 12/728; H05K 1/111; H05K 1/144; H05K 1/181; H05K 1/183; H05K 2201/042; H05K 2201/09036; H05K 2201/09045; H05K 2201/09154; H05K 2201/09409; H05K 2201/10522
See application file for complete search history.

(56) References Cited

U.S. PATENT DOCUMENTS 6,646,885 B1 * 11/2003 Yu .................... G06K 19/07743 235/492
6,719,570 B2 * 4/2004 Tsuchioka ........... G06K 19/077 235/492

(Continued)

FOREIGN PATENT DOCUMENTS

JP 2003-046273 2/2003

*Primary Examiner* — Yuriy Semenenko
(74) *Attorney, Agent, or Firm* — IPUSA, PLLC

(57) ABSTRACT

A circuit board module is electrically connectable to a socket by inserting one end part thereof into the socket, and includes a circuit board and a terminal board having a first surface provided with a column of socket-connection pads and mounted on the surface of the circuit board at the one end part. The terminal board includes first, second, and third pad columns provided on a second surface of the terminal board opposite to the first surface. The circuit board includes fourth, fifth, and sixth pad columns respectively provided on the surface of the circuit board opposing the second surface of the terminal board, at positions opposing the first, second, and third pad columns of the terminal board, respectively.

9 Claims, 12 Drawing Sheets

20 21 23 232 231 233 23r 21n 23s 233L 232L 231L Y X Z

(51) Int. Cl.
*H05K 1/11* (2006.01)
*H01R 12/72* (2011.01)
*H05K 1/02* (2006.01)

(52) U.S. Cl.
CPC .............. *H05K 2201/09154* (2013.01); *H05K 2201/09409* (2013.01); *H05K 2201/09481* (2013.01); *H05K 2201/10522* (2013.01)

(56) References Cited

U.S. PATENT DOCUMENTS

| | | | | |
|---|---|---|---|---|
| 7,032,827 | B2 * | 4/2006 | Wang | G06K 19/077<br>235/441 |
| 7,335,034 | B1 * | 2/2008 | Liu | G06K 19/077<br>439/76.1 |
| 7,361,057 | B1 * | 4/2008 | Bao | G06K 19/07743<br>439/630 |
| 7,656,676 | B2 * | 2/2010 | Roveda | H05K 5/026<br>361/727 |
| 7,909,611 | B2 * | 3/2011 | Miller | H01R 27/00<br>439/60 |
| 8,982,567 | B2 * | 3/2015 | Bang | G06K 7/0047<br>361/737 |
| 8,995,118 | B2 * | 3/2015 | Kang | G06K 19/07732<br>235/441 |
| 2004/0070952 | A1 * | 4/2004 | Higuchi | G06K 19/0719<br>361/737 |

* cited by examiner

CIRCUIT BOARD MODULE

CROSS-REFERENCE TO RELATED APPLICATION

This application is based upon and claims the benefit of priority of the prior Japanese Patent Application No. 2017-090052, filed on Apr. 28, 2017, the entire contents of which are incorporated herein by reference.

FIELD

Certain aspects of the embodiments discussed herein are related to circuit board modules.

BACKGROUND

A conventional circuit board module, including a terminal board, is inserted into and extracted from a socket when required. For example, the terminal board is fixed to one end part of a circuit board by solder. Electronic components are mounted on a surface of the circuit board. The terminal board has a first surface opposing the surface of the circuit board, and a second surface on a side opposite from the first surface. Socket-connection pads for making contact with and electrically connecting to terminals of the socket are provided on the second surface of the terminal board. In addition, pads, having the same size as the socket-connection pads, are provided on the first surface of the terminal board. The pads provided on the first surface of the terminal board are connected to pads provided on the surface of the circuit board by solder. For example, Japanese Laid-Open Patent Publication No. 2003-046273 proposes a circuit board module similar to that described above.

In the circuit board module, the terminal board is required to connect to the circuit board with a high positional accuracy and a high degree of parallelism, in order to improve reliability of the connection between the circuit board module and the socket. However, in the conventional circuit board module, the positional accuracy and the degree of parallelism of the terminal board with respect to the circuit board may not always be satisfactory.

SUMMARY

Accordingly, it is an object in one aspect of the embodiments to provide a circuit board module which can improve positional accuracy and degree of parallelism of a terminal board with respect to a circuit board.

According to one aspect of the embodiments, a circuit board module that is electrically connectable to a socket by inserting one end part thereof into the socket, and extractable from the socket, includes a circuit board having a surface mounted with an electronic component, and a terminal board having a first surface provided with a column of socket-connection pads, and mounted on the surface of the circuit board at the one end part, wherein the terminal board includes a first pad column, a second pad column, and a third pad column respectively provided on a second surface of the terminal board opposite to the first surface, wherein the first pad column includes a plurality of first pads arranged at predetermined intervals in a first direction, the second pad column includes a plurality of second pads, equal to a number of first pads, arranged at the predetermined intervals in the first direction, and the third pad column includes a plurality of third pads, equal to the number of first pads, arranged at the predetermined intervals in the first direction, wherein the second pad column and the third pad column are arranged on both sides of the first pad column along a second direction perpendicular to the first direction, separated from the first pad column, to be line symmetrical to a centerline of the first pad column that is parallel to the first direction, wherein each first pad has an area larger than an area of each second pad and an area of each third pad, wherein, among adjacent first, second, and third pads along the second direction, centerlines of the second pad and the third pad along the second direction match a centerline of the first pad along the second direction, wherein the circuit board includes a fourth pad column of fourth pads, a fifth pad column of fifth pads, and a sixth pad column of sixth pads respectively provided on a surface of the circuit board opposing the second surface of the terminal board, at positions opposing the first pad column, the second pad column, and the third pad column of the terminal board, respectively, and wherein mutually opposing pads of the first pad column and the fourth pad column, the second pad column and the fifth pad column, and the third pad column and the sixth pad column are respectively bonded by a bonding material.

The object and advantages of the embodiments will be realized and attained by means of the elements and combinations particularly pointed out in the claims.

It is to be understood that both the foregoing general description and the following detailed description are exemplary and explanatory and not restrictive of the invention, as claimed.

DESCRIPTION OF EMBODIMENTS

Figure 1A:
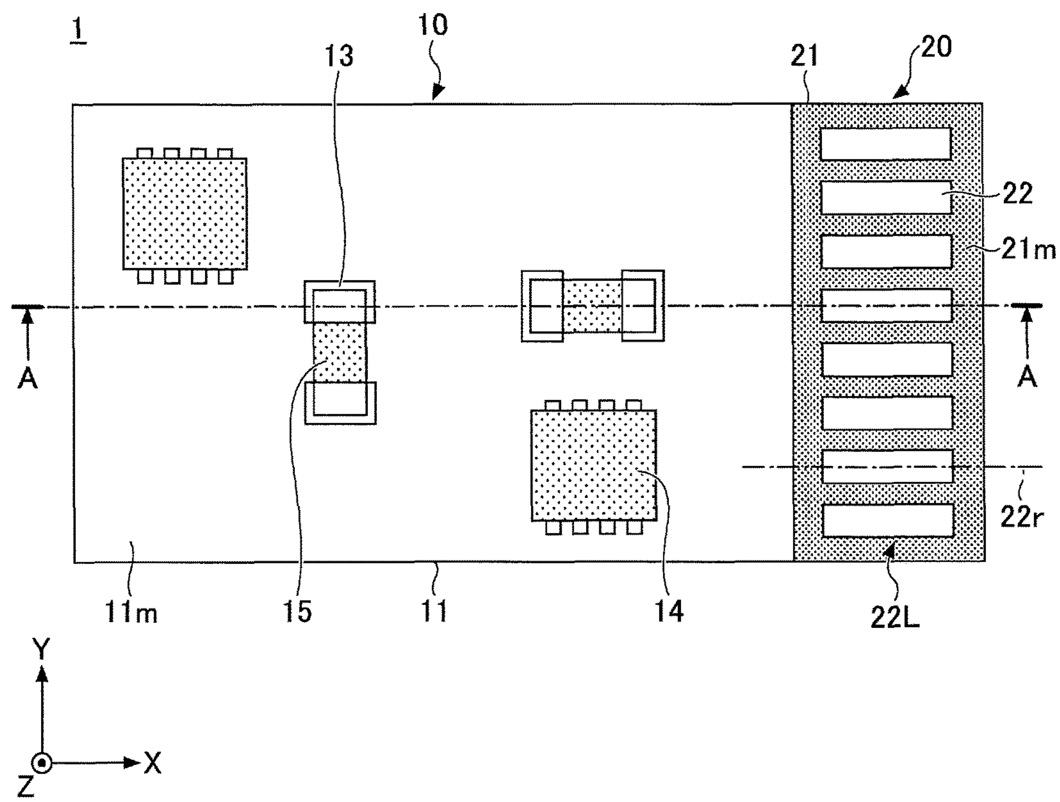
FIGS. 1A and 1B are diagrams illustrating an example of a circuit board module in a first embodiment.

Preferred embodiments of the present invention will be described with reference to the accompanying drawings. In the drawings, those parts that are the same are designated by the same reference numerals, and a repeated description of the same parts may be omitted.

A circuit board module in each embodiment according to the present invention will be described.

First Embodiment

Figure 1B:
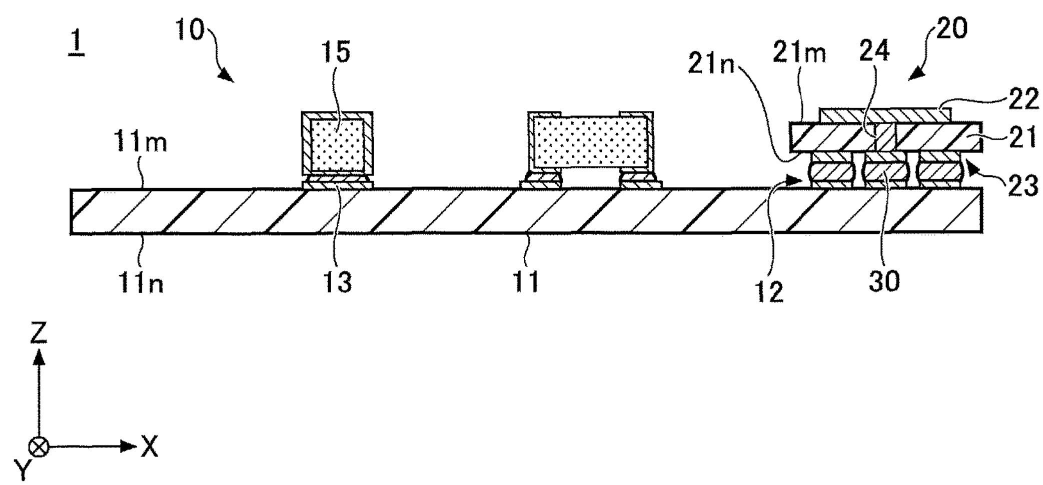
Figure 2A:
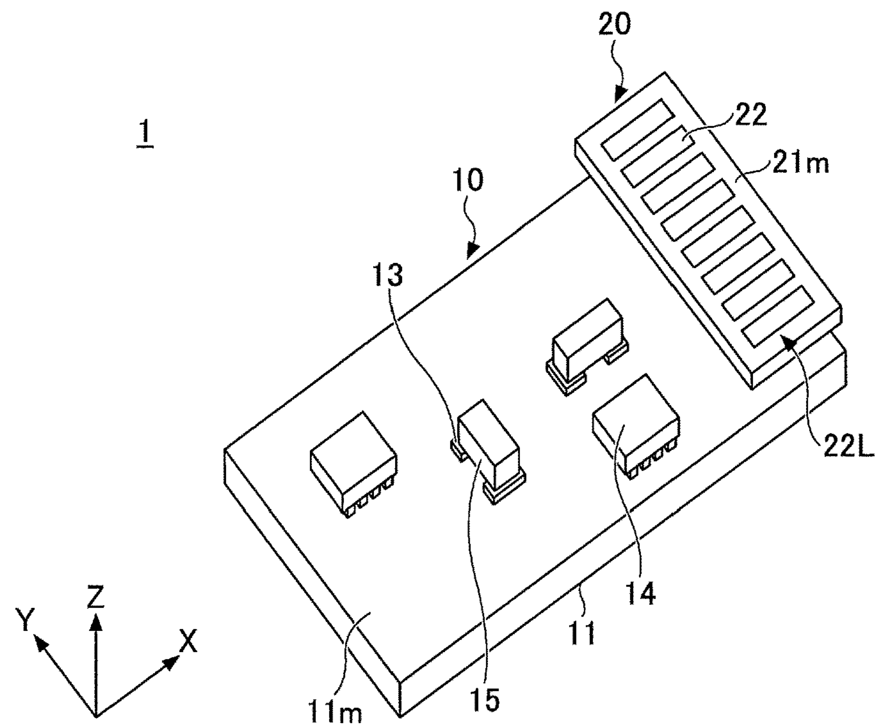
FIGS. 2A and 2B are perspective views illustrating the example of the circuit board module in the first embodiment.
Figure 2B:
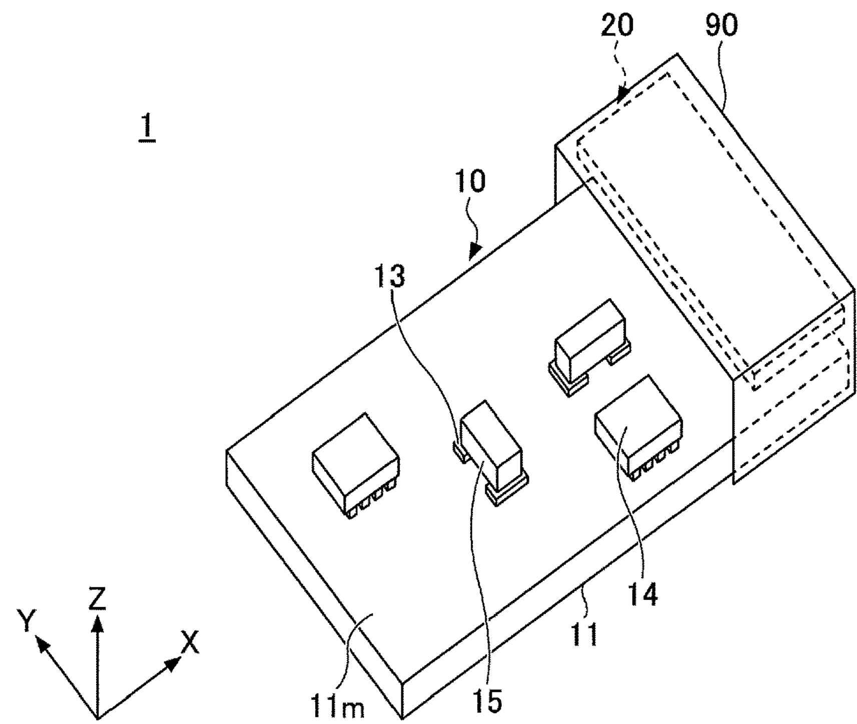

FIGS. 1A and 1B are diagrams illustrating an example of the circuit board module in a first embodiment. FIG. 1A illustrates a plan view of the circuit board module, and FIG. 1B illustrates a cross sectional view of the circuit board module along a line A-A in FIG. 1A. FIGS. 2A and 2B are perspective views illustrating the example of the circuit board module in the first embodiment. FIG. 2A illustrates the circuit board module by itself, and FIG. 2B illustrates the circuit board module in a state in which the circuit board module is inserted into a socket. In FIG. 2B, a socket 90 is not a constituent element of a circuit board module 1.

As illustrated in FIGS. 1A, 1B, 2A, and 2B, the circuit board module 1 includes a circuit board 10, and a terminal board 20. One end part of the circuit board module 1 can be inserted into and extracted from the socket 90. The circuit board module 1 is electrically connected to the socket 90 when one end part of the circuit board module 1 is inserted into the socket 90. In other words, the circuit board module 1 is electrically connectable to the socket 90 by inserting one end part thereof into the socket 90, and the circuit board module 1 is extractable from the socket 90.

The socket 90 is made to conform to a predetermined format or standard, and may be a slot into which a memory card is inserted. The circuit board module 1 has shape and dimensions matching the format or standard of the socket 90. Of course, the socket 90 is not limited to the memory card insertion slot, and may be formed to have arbitrary shape and dimensions. In addition, the circuit board module 1 may be famed to have shape and dimensions that enable the circuit board module 1 to be inserted into and extracted from the socket 90.

The circuit board 10 includes a board (or base) 11, board-connection pads 12, component-connection pads 13, one or more active components 14, and one or more passive components 15. In the following description, the active components 14 and the passive components 15 may be collectively referred to as "electronic components". For the sake of convenience, the active components 14, the passive components 15, and a board (or base) 21 of the terminal board 20 illustrated in FIG. 1A are indicated by half-tone patterns.

For example, the board 11 may be formed by a plate-shaped member or the like including a glass cloth impregnated with a thermosetting insulating resin such as an, epoxy resin or the like. In this example, the board 11 has an approximately rectangular shape in a plan view of the board 11. The plan view of the board 11 or circuit board 10 is a view of the board 11 or circuit board 10 from above a surface 11*m* of the board 11 in FIG. 1A, viewed in a direction perpendicular to the surface 11*m* of the board 11 in FIG. 1B.

The board-connection pads 12 are used to electrically connect the circuit board 10 to the terminal board 20. The board-connection pads 12 may be provided on the surface 11*m* of the board 11 of the circuit board 10, at one end part (right end part in FIG. 1B) of the board 11 corresponding to the one end part of the circuit board module 1. The component-connection pads 13 are used to mount the active components 14 and the passive components 15 on the circuit board 10. The component-connection pads 13 may be provided at arbitrary positions on the surface 11*m* of the board 11 of the circuit board 10. Selected board-connection pads 12 may be electrically connected to selected component-connection pads 13 via wiring patterns (not illustrated). The illustration of the wiring patterns is omitted in FIGS. 1A and 1B to simplify these figures, however, the wiring patterns may be provided on the surface 11*m* of the board 11 of the circuit board 10, and may also be provided on a surface 11*n* of the board 11 of the circuit board 10 on a side opposite from the surface 11*m*, when required. The board-connection pads 12 and the component-connection pads 13 may be made of a material such as copper or the like, for example. Surfaces of the copper or the like forming the board-connection pads 12 and the component-connection pads 13 may be plated with a material such as gold or the like, by electroless plating, for example. Details of the board-connection pads 12 will be described later in the specification.

The active components 14 and the passive components 15 are mounted on the surface 11*m* of the board 11 of the circuit board 10 via a bonding material 30 provided on the component-connection pads 13. The active components 14 may include integrated circuits, transistors, diodes, or the like, for example, and the required active components 14 may be mounted on the circuit board 10. On the other hand, the passive components 15 may include resistors, capacitors, inductors, or the like, for example, and the required passive components 15 may be mounted on the circuit board 10. The bonding material 30 may be solder or the like, for example. The solder may be formed by materials such as an alloy including Pb, an alloy of Sn and Cu, an alloy of Sn and Sb, an alloy of Sn and Ag, an alloy of Sn, Ag, and Cu, or the like, for example. The active components 14 and the passive components 15 may be provided on the surface 11*n* of the board 11 of the circuit board 10, when required. In this case, the wiring patterns may also be provided on the surface 11*n* of the board 11 of the circuit board 10.

The terminal board 20 includes the board 21, socket-connection pads 22, board-connection pads 23, and via wirings 24. The terminal board 20 is provided at one end part (right end part in FIGS. 1A and 1B) of the board 11 of the circuit board 10, corresponding to the one end part of the circuit board module 1. The board-connection pads 23 of the terminal board 20 are connected to the board-connection pads 12 of the circuit board 10 via the bonding material 30.

For example, the board 21 may be formed by a plate-shaped member or the like including a glass cloth impregnated with a thermosetting insulating resin such as an epoxy resin or the like. In this example, the board 21 has an approximately rectangular shape in a plan view of the board 21. The plan view of the board 21 is a view of the board 21 from above a surface 21*m* of the board 21 of the terminal board 20 in FIG. 1A, viewed in a direction perpendicular to the surface 21*m* of the board 21 in FIG. 1B.

The socket-connection pads 22 are provided on the surface 21*m* of the board 21 of the terminal board 20, and make contact with and electrically connect to terminals (not illustrated) within the socket 90. The socket-connection pads 22 may have an approximately rectangular shape that is elongated in an X-axis direction in FIG. 1A, for example. A centerline 22*r* of the socket-connection pad 22, indicated by a one-dot chain line in FIG. 1A, is parallel to the X-axis direction. A plurality of socket-connection pads 22 are arranged at predetermined intervals in a Y-axis direction in FIG. 1A, for example. In each of the embodiments, the X-axis direction, Y-axis direction, and Z-axis direction are perpendicular to each other as in the case of XYZ coordinate systems. In this example, 8 socket-connection pads 22 are arranged in the Y-axis direction, to form a column 22L of socket-connection pads 22. The number of socket-connection pads 22 that are provided, and shapes of the socket-connection pads 22 may be appropriately determined according to required specifications. The size or dimensions of the socket-connection pads 22 may also be appropriately determined according to required specifications.

The board-connection pads 23 are used to electrically connect the terminal board 20 to the circuit board 10. The board-connection pads 23 may be provided on the surface 21*n* of the board 21 of the terminal board 20. The socket-connection pads 22 and the board-connection pads 23 may be made of a material such as copper or the like, for example. Durability is required of the socket-connection pads 22 because the circuit board module 1 is frequently inserted into and frequently extracted from the socket 90 in a repeated manner, for example. For this reason, surfaces of the copper or the like forming the socket-connection pads 22 are preferably plated with a material such as hard gold or the like, by electroless plating, for example. The hard gold plating improves hardness, abrasive resistance, or the like by including eutectic cobalt, eutectic nickel, or the like in the plated gold. Surfaces of the copper or the like forming the board-connection pads 23 may be plated with a material such as gold by electroless plating. Details of the board-connection pads 23 will be described later in the specification.

Selected socket-connection pads 22 and selected board-connection pads 23 may be electrically connected via the via wirings 24 penetrating the board 21. The socket-connection pads 22 are electrically connected to at least one of pads 231, 232, and 233 forming the board-connection pads 23. The socket-connection pads 22 may be electrically connected to two of the pads 231, 232, and 233, or may be electrically connected to each of the pads 231, 232, and 233. The pads 231, 232, and 233 forming the board-connection pads 23 will be described later in the specification.

According to the circuit board module 1, the one end part of the board 11 of the circuit board 10, where the terminal board 20 is mounted, is inserted into and extracted from the socket 90. Accordingly, the terminal board 20 is required to connect to the circuit board 10 with a high positional accuracy and a high degree of parallelism. For this reason, measures are taken in the board-connection pads 12 of the terminal board 20 and in the board-connection pads 23 of the terminal board 20.

Figure 3A:
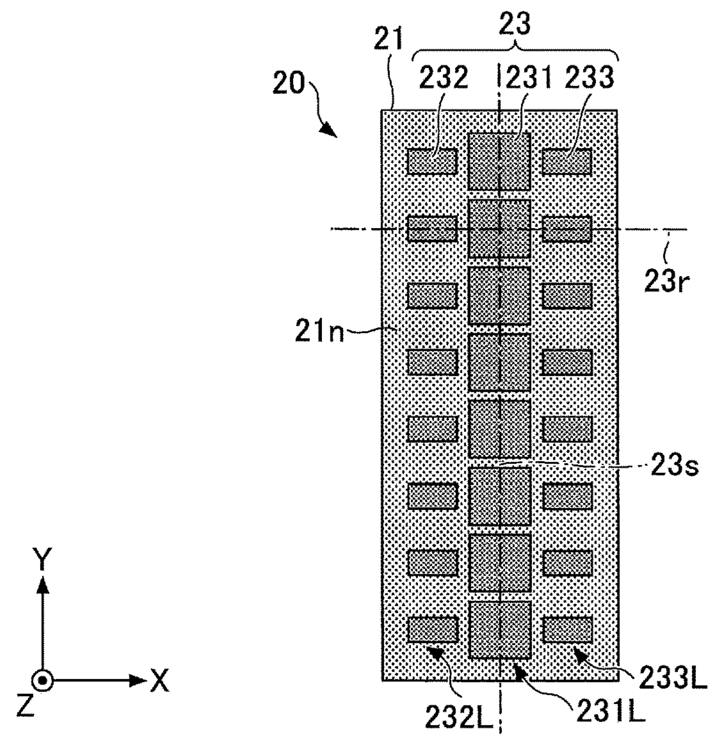
FIGS. 3A and 3B are diagrams illustrating an example of board-connection pads of the circuit board module in the first embodiment.
Figure 3B:
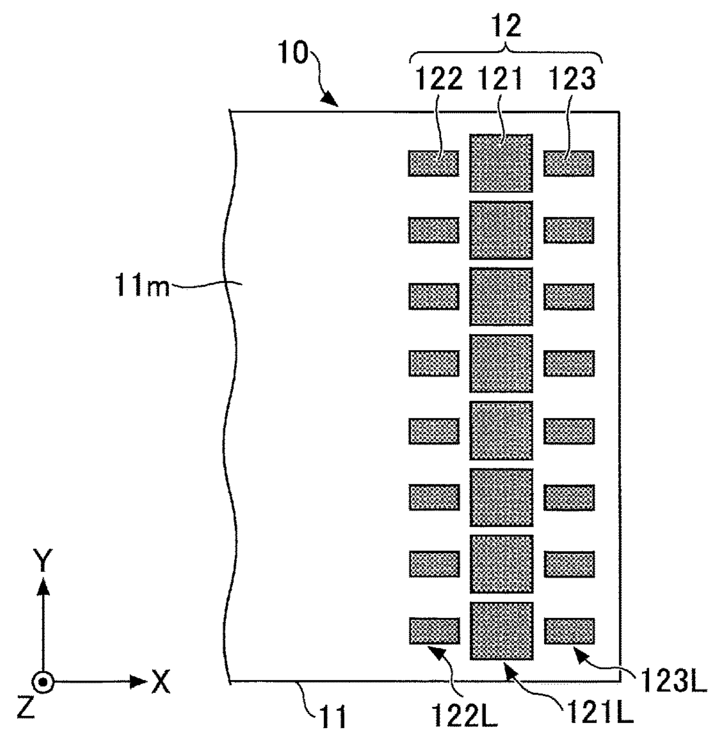

FIGS. 3A and 3B are diagrams illustrating an example of the board-connection pads of the circuit board module in the first embodiment. FIG. 3A illustrates a view of the terminal board 20 in its entirety viewed from one side opposing the circuit board 10, and FIG. 3B illustrates a view of the terminal board 20 viewed from another side, that is, from above the surface 11*m* of the board 11 of the circuit board 10.

As illustrated in FIG. 3A, the board-connection pads 23 provided on the surface 21*n* of the board 21 of the terminal board 20, include the pads 231, 232, and 233. The pads 231 are arranged on the surface 21*n* of the board 21 of the terminal board 20, approximately at a center along the X-axis direction. The pads 232 and the pads 233 are arranged on the surface 21*n* of the board 21 of the terminal board 20, on both sides of the pads 231 along the X-axis direction. The adjacent pads 231, 232, and 233 along the X-axis direction are arranged at predetermined intervals, and a gap of approximately 1 mm, for example, is provided between 2 mutually adjacent pads 231 and 232, and between 2 mutually adjacent pads 231 and 233.

Among the adjacent pads 231, 232, and 233 along the X-axis direction, a centerline 23*r* of the pad 231, indicated by a one-dot chain line in FIG. 3A, is parallel to the X-axis direction. In addition, centerlines of the pads 232 and 233 are parallel to the X-axis direction, and match the centerline 23*r* of the pad 231. For example, the centerline 23*r* approximately matches and overlaps the centerline 22*r* of the corresponding socket-connection pad 22 in the plan view illustrated in FIG. 1A.

The pads 232 and the pads 233 may have approximately rectangular shapes with approximately same areas or sizes. On the other hand, the pads 231 may have an approximately rectangular shape, with an area or size larger than the area or size of each of the pads 232 and 233. A ratio of the area of the pad 231 to the area of each of the pads 232 and 233 may be approximately 1:0.5 to approximately 1:0.8, for example. A total area of the 3 adjacent pads 231, 232, and 233 is designed to be larger than the area of the socket-connection pad 22. A ratio of the total area of the 3 adjacent pads 231, 232, and 233 to the area of the socket-connection pad 22 may be approximately 1.05:1 to approximately 2.0:1, for example.

A plurality of pads 231 are arranged at predetermined intervals in the Y-axis direction in FIG. 3A, for example. In this example, 8 pads 231 are arranged in the Y-axis direction, to form a pad column 231L. A plurality of pads 232 are arranged at predetermined intervals in the Y-axis direction in FIG. 3A. In this example, the number of pads 232 is the same as the number of pads 231, and 8 pads 232 are arranged in the Y-axis direction, to form a pad column 232L. A plurality of pads 233 are arranged at predetermined intervals in the Y-axis direction in FIG. 3A. In this example, the number of pads 233 is the same as the number of pads 231, and 8 pads 233 are arranged in the Y-axis direction, to form a pad column 233L. A centerline 23*s* of the pad column 231L, indicated by a one-dot chain line in FIG. 3A, is parallel to the Y-axis direction. The pad column 232L and the pad column 233L are arranged on both sides of the pad column 231L along the X-axis direction, separated from the pad column 231L, to be line symmetrical to the centerline 23*s* that is parallel to the Y-axis direction. A gap is formed between the pad columns 231L and 232L, and a gap is formed between the pad columns 231L and 233L.

As illustrated in FIG. 3B, the board-connection pads 12 provided on the surface 11*m* of the board 11 of the circuit board 10, include pads 121, 122, and 123. The pads 121 are arranged on the surface 11*m* of the board 11, at the one end part of the board 11 of the circuit board 10. The pads 122 and the pads 123 are arranged on the surface 11*m* of the board 11 of the circuit board 10, on both sides of the pads 121 along the X-axis direction. The adjacent pads 121, 122, and 123 along the X-axis direction are arranged at predetermined intervals, and a gap of approximately 1 mm, for example, is provided between 2 mutually adjacent pads 121 and 122, and between 2 mutually adjacent pads 121 and 123.

A plurality of pads 121 are arranged at predetermined intervals in the Y-axis direction in FIG. 3B, for example. In this example, 8 pads 121 are arranged in the Y-axis direction, to form a pad column 121L. A plurality of pads 122 are arranged at predetermined intervals in the Y-axis direction in FIG. 3B. In this example, the number of pads 122 is the same as the number of pads 121, and 8 pads 122 are arranged in the Y-axis direction, to form a pad column 122L. A plurality of pads 123 are arranged at predetermined intervals in the Y-axis direction in FIG. 3B. In this example, the number of pads 123 is the same as the number of pads 121, and 8 pads 123 are arranged in the Y-axis direction, to form a pad column 123L.

A relationship of the area of the pad 121 to the areas of the pads 122 and 123, and a symmetry of the pads 121, 122, and 123 with respect to a centerline parallel to the X-axis direction, may be the same as the relationship of the area of the pad 231 to the areas of the pads 232 and 233, and the symmetry of the pads 232 and 233 with respect to the centerline 23*r*, respectively. In addition, a line symmetry of the pad columns 122L and 123L with respect to a centerline of the pad column 121L, parallel to the Y-axis direction, may be the same as the line symmetry of the pad columns 232L and 233L with respect to the centerline 23*s* of the pad column 231L.

In other words, the pads 121, 122, and 123 are provided on the surface 11*m* of the board 11 of the circuit board 10, at positions to oppose the pads 231, 232, and 233 provided on the surface 21*n* of the board 21 of the terminal board 20, respectively. The pads 121, 122, and 123 are bonded to the corresponding pads 231, 232, and 233 via the bonding material 30, respectively.

Accordingly, in the circuit board module 1, the board-connection pads 12 form 3 pad columns 121L, 122L, and 123L that are line symmetrical to the centerline of the pad column 121L, parallel to the Y-axis direction. In addition, the area of each pad 121 forming the center pad. column 121L is made larger than the area of each of the pads 122 and 123 respectively forming the pad columns 122L and 123L arranged on both sides of the center pad column 121L. Similarly, the board-connection pads 23 form 3 pad columns 231L, 232L, and 233L that are line symmetrical to the centerline 23*s* of the pad column 231L, parallel to the Y-axis direction. In addition, the area of each pad 231 forming the center pad column 231L is made larger than the area of each of the pads 232 and 233 respectively forming the pad columns 232L and 233L arranged on both sides of the center pad column 231L.

As a result, self-alignment function improves when bonding the center pad column 121L and the center pad column 231L by the bonding material 30, to improve the positioning accuracy of the terminal board 20 with respect to the circuit board 10.

In addition, the total area of the 3 adjacent pads 231, 232, and 233 is designed to be larger than the area of the socket-connection pad 22, to increase pad areas that are bonded when bonding the circuit board 10 and the terminal board 20 together using the bonding material 30. For this reason, it is possible to improve bonding strength of the terminal board 20 with respect to the circuit board 10, and to reduce warping of the terminal board 20.

Further, the pad columns 122L and 123L are arranged at line symmetrical positions with respect to the centerline of the pad column 121L, parallel to the Y-axis direction. Similarly, the pad columns 232L and 233L are arranged at line symmetrical positions with respect to the centerline 23*s* of the pad column 231L, parallel to the Y-axis direction. Hence, it is possible to improve the degree of parallelism of the terminal board 20 with respect to the circuit board 10.

Modification of First Embodiment

In a modification of the first embodiment, the circuit board module has an external shape different from that of the first embodiment. In the modification of the first embodiment, those parts that are the same as those corresponding parts of the first embodiment are designated by the same reference numerals, and a repeated description of the same parts may be omitted.

Figure 4A:
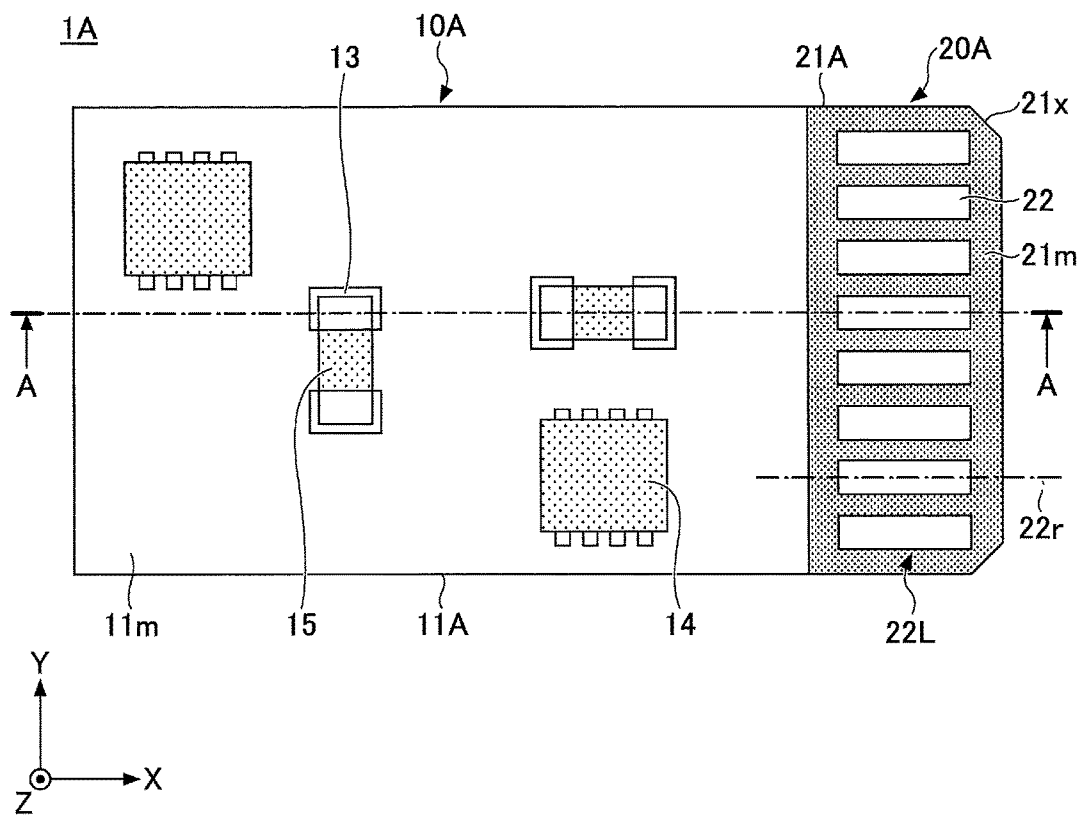
FIGS. 4A and 4B are diagrams illustrating an example of the circuit board module in a modification of the first embodiment.
Figure 4B:
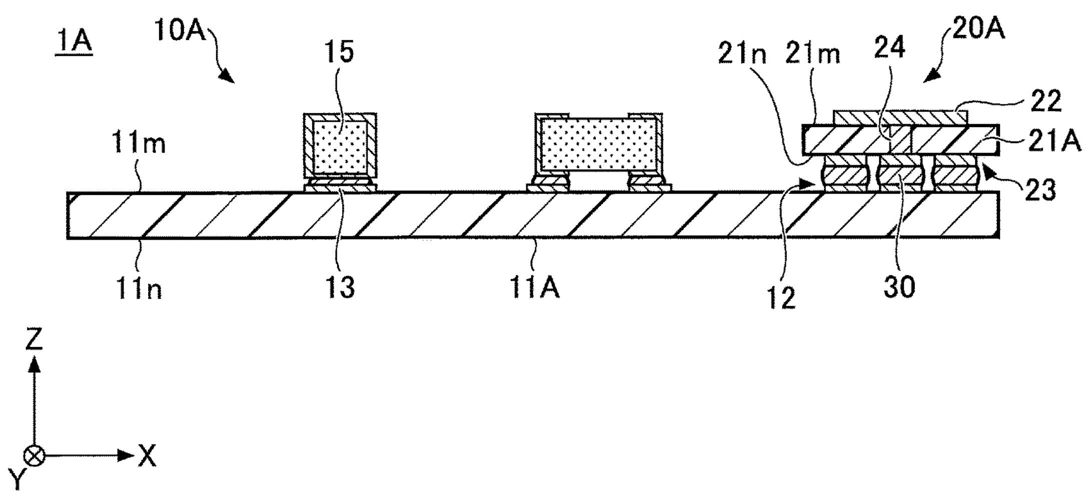
Figure 5A:
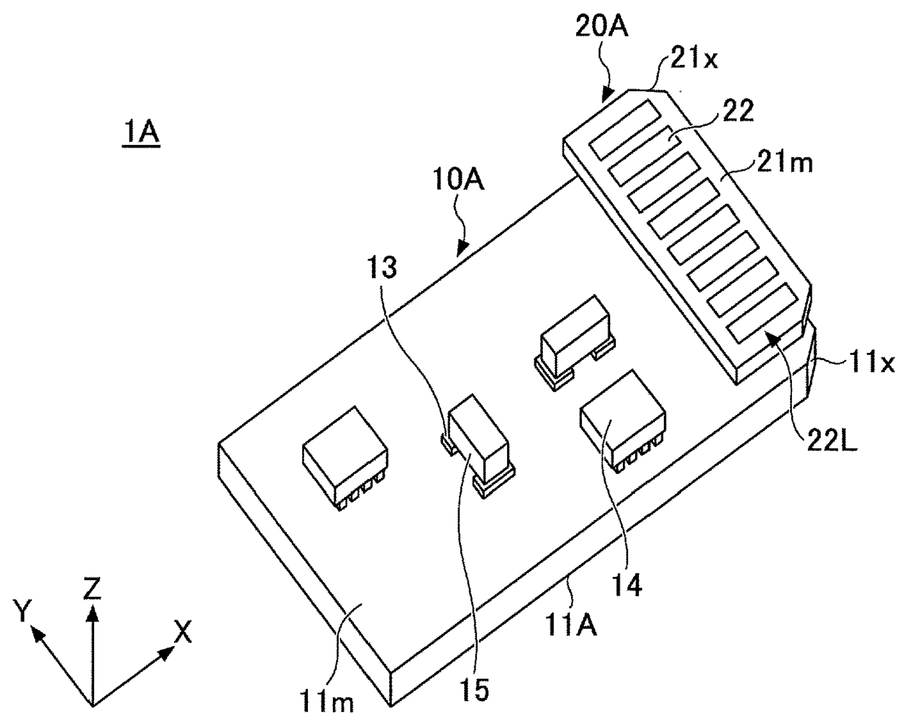
FIGS. 5A and 5B are perspective views illustrating the example of the circuit board module in the modification of the first embodiment.
Figure 5B:
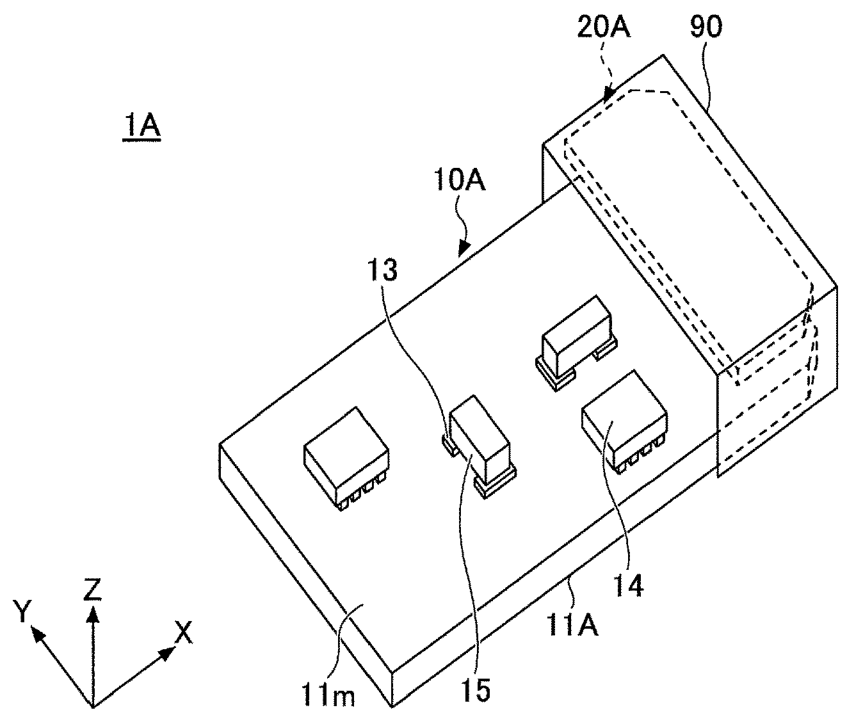

FIGS. 4A and 4B are diagrams illustrating an example of the circuit board module in the modification of the first embodiment. FIG. 4A illustrates a plan view of the circuit board, and FIG. 4B illustrates a cross sectional view of the circuit board along a line A-A in FIG. 4A. FIGS. 5A and 5B are perspective views illustrating the example of the circuit board module in the modification of the first embodiment. FIG. 5A illustrates the circuit board module by itself, and FIG. 5B illustrates the circuit board module in a state in which the circuit board module is inserted into the socket. In FIG. 5B, a socket 90 is not a constituent element of a circuit board module 1A.

As illustrated in FIGS. 4A, 4B, 5A, and 5B, the circuit board module 1A includes a circuit board 10A, and a terminal board 20A. The circuit board 10A differs from the circuit board 10 illustrated in FIGS. 1A and 1B, in that the circuit board 10A uses a board 11A in place of the board 11. In addition, the terminal board 20A differs from the terminal board 20 illustrated in FIGS. 1A and 1B, in that the terminal board 20A uses a board 21A in place of the board 21.

An oblique cutout 11*x* illustrated in FIG. 5A is provided at each of 2 corners of the board 11A at the one end part of the board 11A that is inserted into and extracted from the socket 90. The oblique cutout 11*x* is an obliquely cut or chamfered portion of the board 11A. The oblique cutout 11*x* may be replaced by a rounded corner part of the board 11A. On the other hand, an oblique cutout 21*x* illustrated in FIGS. 4A and 5A is provided at each of 2 corners of the board 21A at the one end part of the board 11A that is inserted into and extracted from the socket 90. The oblique cutout 21*x* is an obliquely cut or chamfered portion of the board 21A. The oblique cutout 21*x* may be replaced by a rounded corner part of the board 21A. Otherwise, the circuit board module 1A illustrated in FIGS. 4A, 4B, 5A, and 5B is the same as the circuit board module 1 of the first embodiment illustrated in FIGS. 1A, 1B, 2A, and 2B.

According to the circuit board module 1A, the oblique cutouts 11*x* are provided at the 2 corners of the board 11A, and the oblique cutouts 21*x* are provided at the 2 corners of the board 21A, at the one end part of the board 11A that is inserted into and extracted from the socket 90. For this reason, it is possible to reduce damage to the terminal board 20A that may occur when the circuit board module 1A is frequently inserted into and frequently extracted from the socket 90 in a repeated manner, for example. Otherwise, effects obtainable by the modification of the first embodiment are the same as those obtainable by the first embodiment.

Second Embodiment

In a second embodiment, the circuit board module has an external shape different from that of the first embodiment. In the second embodiment, those parts that are the same as those corresponding parts of the first embodiment are designated by the same reference numerals, and a repeated description of the same parts may be omitted.

Figure 6A:
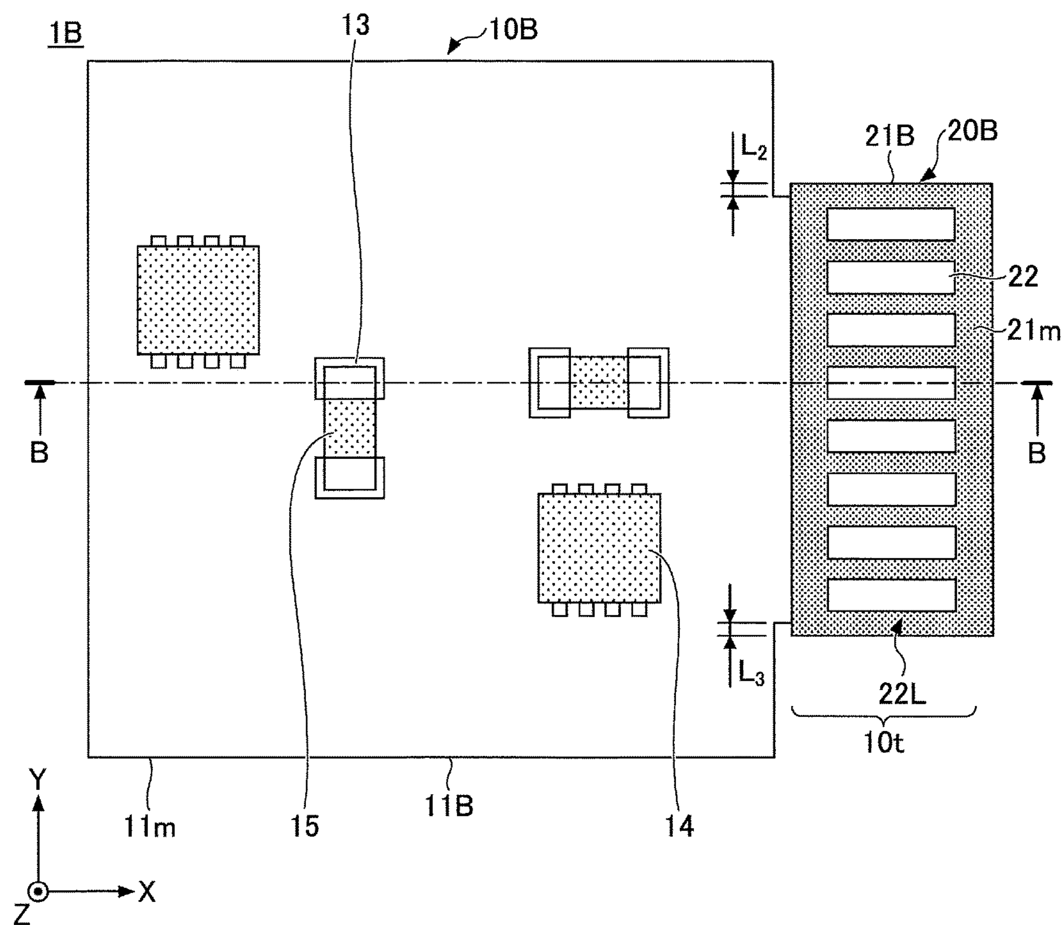
FIGS. 6A and 6B are diagrams illustrating an example of the circuit board module in a second embodiment.
Figure 6B:
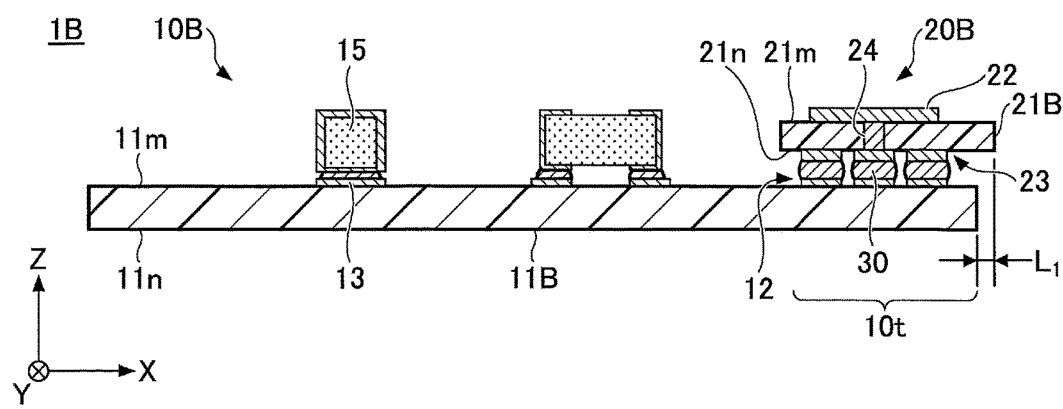
Figure 7:
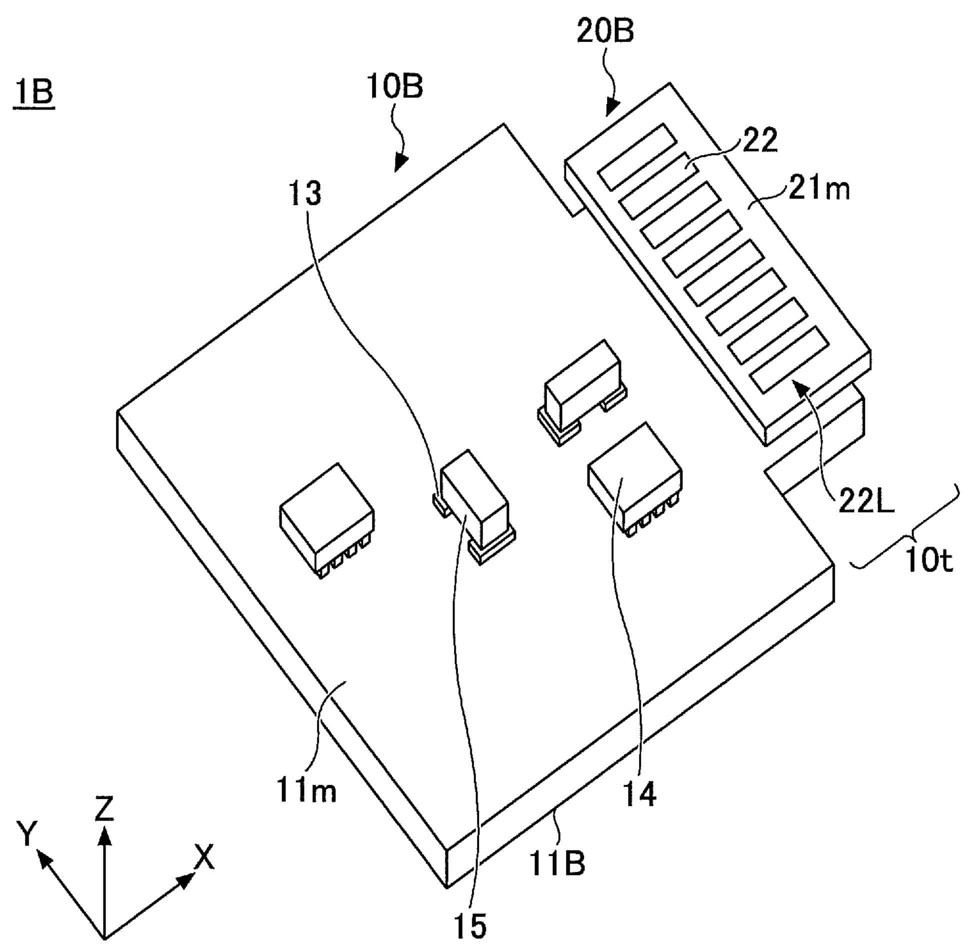
FIG. 7 is a perspective view illustrating the example of the circuit board module in the second embodiment.

FIGS. 6A and 6B are diagrams illustrating an example of the circuit board module in the second embodiment. FIG. 6A illustrates a plan view of the circuit board module, and FIG. 6B illustrates a cross sectional view of the circuit board module along a line B-B in FIG. 6A. FIG. 7 is a perspective view illustrating the example of the circuit board module in the second embodiment.

As illustrated in FIGS. 6A, 6B, and 7, a circuit board module 1B includes a circuit board 10B, and a terminal board 20B. The circuit board 10B differs from the circuit board 10 illustrated in FIGS. 1A and 1B, in that the circuit board 10B uses a board 11B in place of the board 11. In addition, the terminal board 20B differs from the terminal board 20 illustrated in FIGS. 1A and 1B, in that the terminal board 20B uses a board 21B in place of the board 21.

The board 11B of the circuit board 10B includes a projecting region 10*t* that projects towards the socket 90 into which the circuit board module 1B is inserted, in the plan view illustrated in FIG. 6A. The terminal board 21B is mounted on the projecting region 10*t*. In addition, the board 21B has an approximately rectangular shape in the plan view of the board 21B illustrated in FIG. 6A, similarly to the board 21 illustrated in FIG. 1A.

The board-connection pads 12 are provided in the projecting region 10*t* of the board 11B. The board-connection pads 12 are electrically connected to the board-connection pads 23 provided on the surface 21*n* of the board 21B, via the bonding material 30.

An outer periphery of the circuit board 10B at the one end part of the circuit board module 1B opposes an inner wall of the socket 90 when the circuit board module 1B is inserted into the socket 90. An outer periphery of the terminal board 20B at the one end part of the circuit board module 1B opposes the inner wall of the socket 90 when the circuit board module 1B is inserted into the socket 90. The outer periphery of the terminal board 20B projects more towards the outside in an inserting direction of the circuit board module 1B, that is, towards the right side in FIG. 6B, than the outer periphery of the circuit board 10B, at the one end part of the circuit board module 1B. A front end surface of the board 21B along the inserting direction at the one end part of the circuit board module 1B projects by a distance $L_1$ from a front end surface of the board 11B, as illustrated in FIG. 6B. In addition, a left end surface of the board 21B projects more towards the left side along the inserting direction, that is, towards a top side in FIG. 6A, than a left end surface of the board 11B. A right end surface of the board 21B projects more towards the right side along the inserting direction, that is, towards a bottom side in FIG. 6A, than a right end surface of the board 11B. The left end surface of the board 21B projects by a distance $L_2$ from the left end surface of the board 11B, and the right end surface of the board 21B projects by a distance $L_3$ from the right end surface of the board 11B. Each of the distances $L_1$, $L_2$, and $L_3$ may be set to 100 μm, for example. However, the distances $L_1$, $L_2$, and $L_3$ may be set to a value other than 100 μm, or to mutually different values, when required. Otherwise, the circuit board module 1B illustrated in FIGS. 6A and 6B is the same as the circuit board module 1 of the first embodiment illustrated in FIGS. 1A and 1B.

Because the front, left, and right end surfaces of the board 21B project more towards the respective side than the front, left, and right end surfaces of the board 11B, a size tolerance of the board 11B can be ignored, and only a size tolerance of the board 21B requires consideration when inserting the circuit board module 1B into and extracting the circuit board module 1B from the socket 90. Hence, the board 21B itself can maintain a high alignment function with respect to a fitting or receiving part of the socket 90, and it is possible to ensure high positioning accuracy between the circuit board module 1B and the socket 90. As a result, it is possible to reduce poor electrical connection or electrical connection failure when the circuit board module 1B is inserted into the socket 90. Otherwise, effects obtainable by the second embodiment are the same as those obtainable by the first embodiment.

First Modification of Second Embodiment

In a first modification of the second embodiment, the circuit board module has an external shape different from that of the second embodiment. In the first modification of the second embodiment, those parts that are the same as those corresponding parts of the embodiments and modification described above are designated by the same reference numerals, and a repeated description of the same parts may be omitted.

Figure 8A:
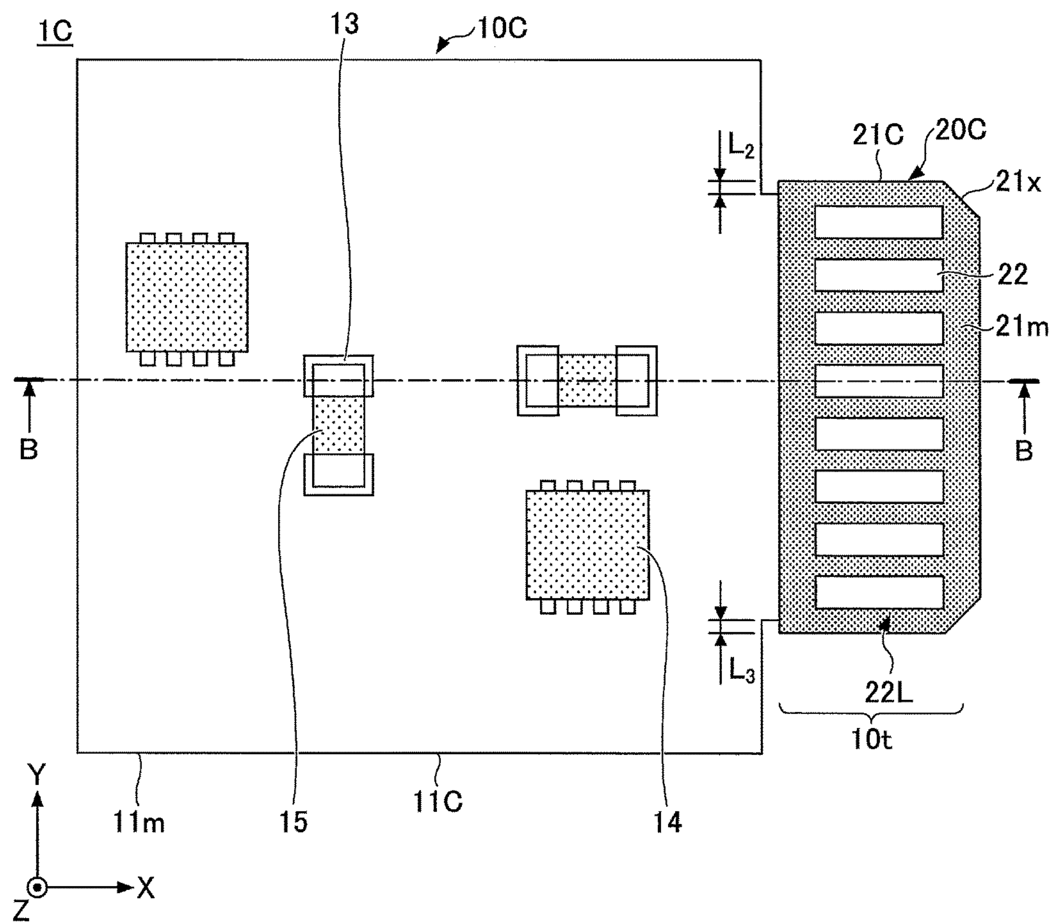
FIGS. 8A and 8B are diagrams illustrating an example of the circuit board module in a first modification of the second embodiment.
Figure 8B:
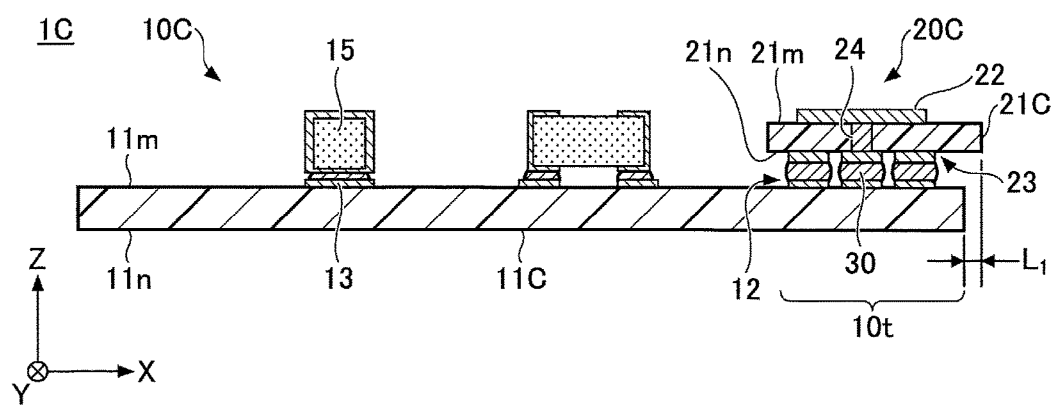
Figure 9:
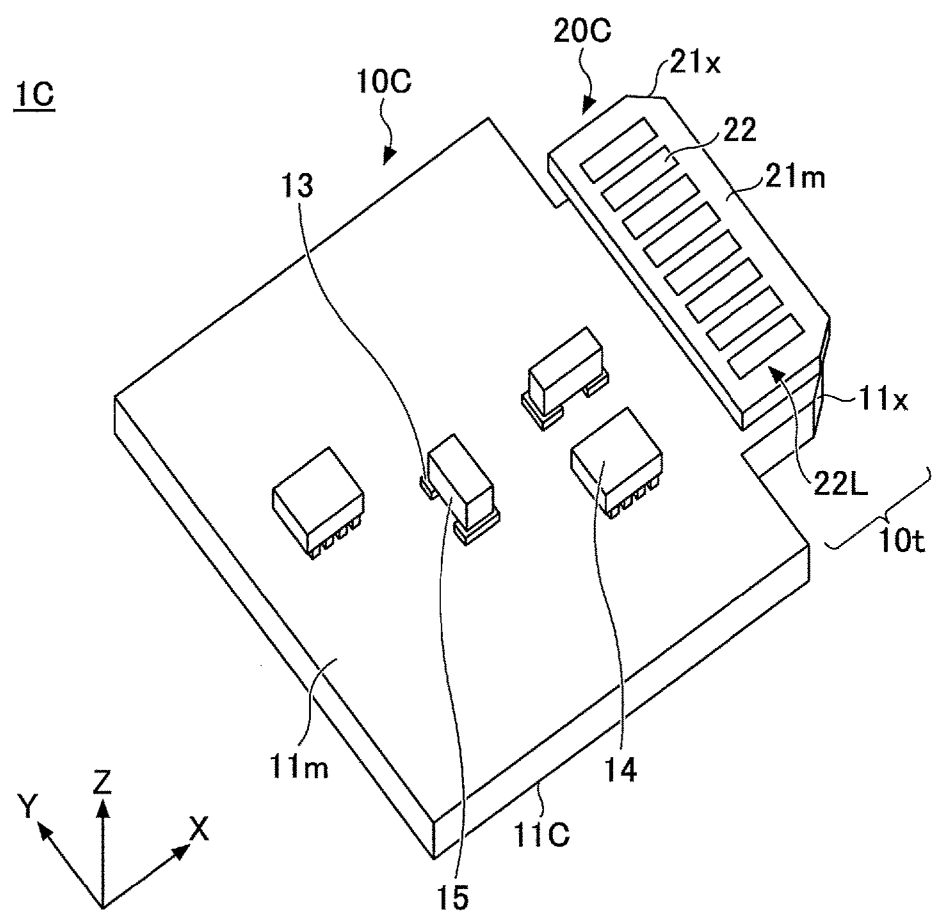
FIG. 9 is a perspective view illustrating the example of the circuit board module in the first modification of the second embodiment.

FIGS. 8A and 8B are diagrams illustrating an example of the circuit board module in the first modification of the second embodiment. FIG. 8A illustrates a plan view of the circuit board module, and FIG. 8B illustrates a cross sectional view of the circuit board module along a line B-B in FIG. 8A. FIG. 9 is a perspective view illustrating the example of the circuit board module in the first modification of the second embodiment.

As illustrated in FIGS. 8A, 8B, and 9, a circuit board module 1C includes a circuit board 10C, and a terminal board 20C. The circuit board 10C differs from the circuit board 10B illustrated in FIGS. 6A, 6B, and 7, in that the circuit board 10C uses a board 11C in place of the board 11B. In addition, the terminal board 20C differs from the terminal board 20B illustrated in FIGS. 6A, 6B, and 7, in that the terminal board 20C uses a board 21C in place of the board 21B.

An oblique cutout 11*x* illustrated in FIG. 9 is provided at each of 2 corners of the board 11C at the one end part of the board 11C that is inserted into and extracted from the socket 90, similarly as in the case of the board 11A illustrated in FIG. 5A. On the other hand, an oblique cutout 21*x* illustrated in FIGS. 8A and 9 is provided at each of 2 corners of the board 21C at the one end part of the board 11C that is inserted into and extracted from the socket 90, similarly as in the case of the board 21A illustrated in FIGS. 4A and 5A. Otherwise, the circuit board module 1C illustrated in FIGS. 8A, 8B, and 9 is the same as the circuit board module 1B of the second embodiment illustrated in FIGS. 6A, 6B, and 7.

According to the circuit board module 1C, the oblique cutouts 11*x* are provided at the 2 corners of the board 11C, and the oblique cutouts 21*x* are provided at the 2 corners of the board 21C, at the one end part of the board 11C that is inserted into and extracted from the socket 90. For this reason, it is possible to reduce damage to the terminal board 20C that may occur when the circuit board module 1C is frequently inserted into and frequently extracted from the socket 90 in a repeated manner, for example. Otherwise, effects obtainable by the first modification of the second embodiment are the same as those obtainable by the second embodiment.

Second Modification of Second Embodiment

In a second modification of the second embodiment, the circuit board module has an external shape different from that of the first modification of the second embodiment. In the second modification of the second embodiment, those parts that are the same as those corresponding parts of the embodiments and modifications described above are designated by the same reference numerals, and a repeated description of the same parts may be omitted.

Figure 10:
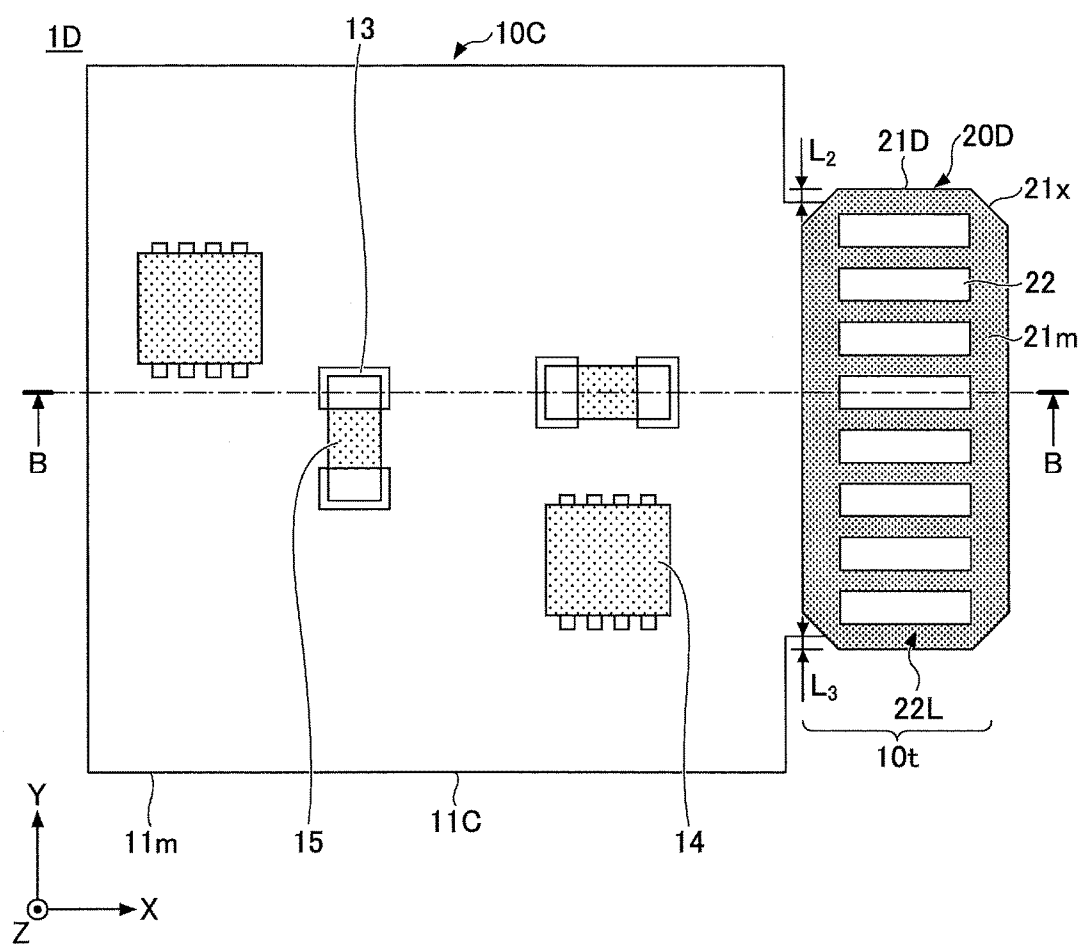
FIG. 10 is a plan view illustrating an example of the circuit board module in a second modification of the second embodiment.

FIG. 10 is a plan view illustrating an example of the circuit board module in the second modification of the second embodiment. Illustration of a cross sectional view of the circuit board module in the second modification of the second embodiment will be omitted, since a cross sectional view of the circuit board module along a line B-B in FIG. 10 is the same as the cross sectional view illustrated in FIG. 8B.

As illustrated in FIG. 10, a circuit board module 1D includes a circuit board 10C, and a terminal board 20D. The terminal board 20D differs from the terminal board 20C illustrated in FIGS. 8A, 8B, and 9, in that the terminal board 20D uses a board 21D in place of the board 21C.

In the board 21C illustrated in FIGS. 8A and 9, the oblique cutouts 21*x* are provided at the 2 corners of the board 21C, at the one end part of the board 11C that is inserted into and extracted from the socket 90. On the other hand, in the board 21D illustrated in FIG. 10, oblique cutouts 21*x* are provided at 4 corners of the board 21D. Otherwise, the circuit board module 1D is the same as the circuit board module 1C illustrated in FIGS. 8A, 8B, and 9.

According to the circuit board module 1D, the oblique cutouts 21*x* are provided at the 4 corners of the board 21D, at the one end part of the board 11C that is inserted into and extracted from the socket 90. For this reason, it is possible to further reduce damage to the terminal board 20D that may occur when the circuit board module 1D is frequently inserted into and frequently extracted from the socket 90 in a repeated manner, for example. Otherwise, effects obtainable by the second modification of the second embodiment are the same as those obtainable by the second embodiment.

Third Embodiment

In a third embodiment, a cavity for mounting a component is provided in the circuit board. In the third embodiment, those parts that are the same as those corresponding parts of the embodiments and modifications described above are designated by the same reference numerals, and a repeated description of the same parts may be omitted.

Figure 11A:
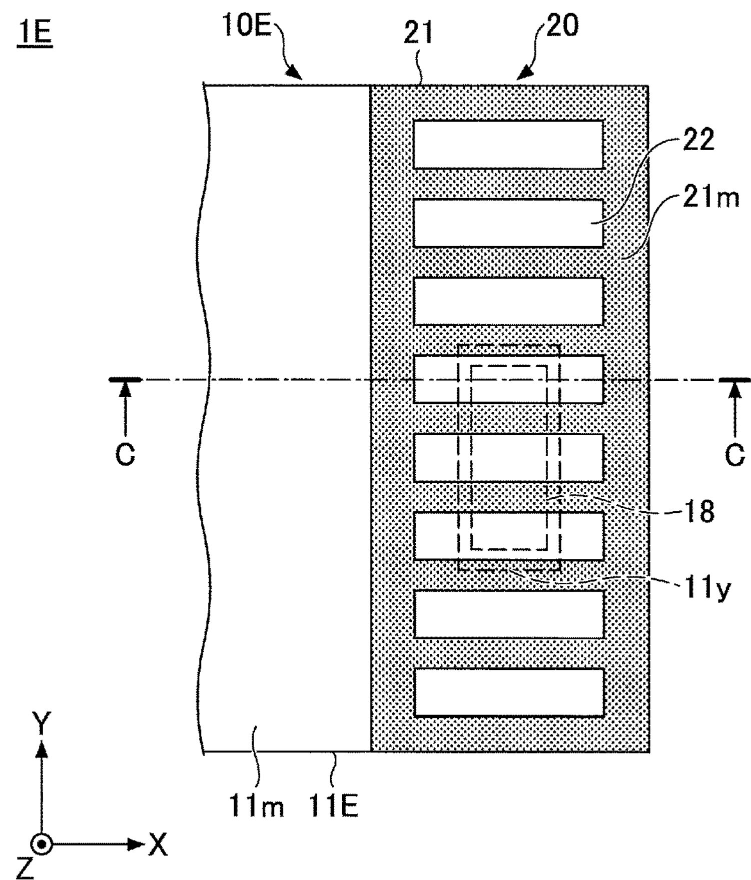
FIGS. 11A and 11B are diagrams illustrating an example of the circuit board module, in a third embodiment.
Figure 11B:
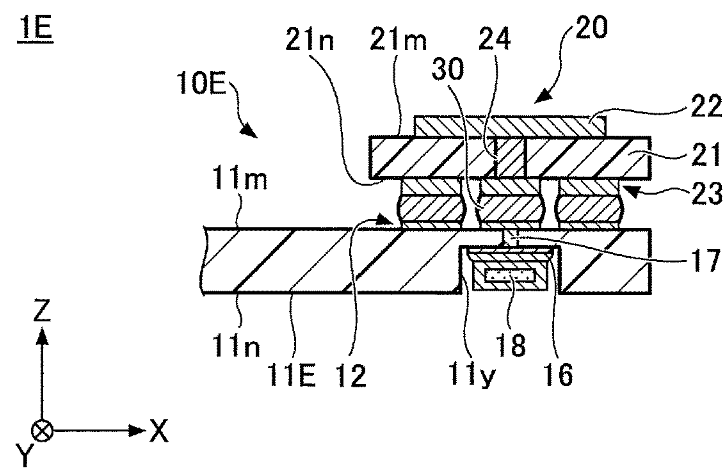

FIGS. 11A and 11B are diagrams illustrating an example of the circuit board module in the third embodiment. FIG. 11A illustrates a partial plan view of the circuit board module in a vicinity of the one end part inserted into the socket, and FIG. 11B illustrates a cross sectional view of the circuit board module along a line C-C in FIG. 11A.

As illustrated in FIGS. 11A and 11B, a circuit board module 1E includes a circuit board 10E, and a terminal board 20. The circuit board 10E differs from the circuit board 10 illustrated in FIGS. 1A, 1B, 2A, and 2B, in that the circuit board 10E uses a board 11E in place of the board 11.

In the circuit board 10E, a cavity 11*y* extends from the surface 11*n* towards the surface 11*m* of the board 11E by a predetermined depth as illustrated in FIG. 11B. The cavity 11*y* is defined by inner sidewalls of the board 11E, and an inner surface of the board 11E forming a bottom part of the cavity 11*y*. The cavity 11*y* is formed in a region where the board 11E and the terminal board 20 overlap in the plan view, as illustrated in FIG. 11A. The cavity 11*y* is used for mounting a component therein. For this reason, the shape of the cavity 11*y* in the plan view, and the depth of the cavity 11*y*, may be appropriately determined according to the shape and size of the component that is to be mounted in the cavity 11*y*.

Component-connection pads 16 are provided at the bottom part of the cavity 11*y*, and a decoupling capacitor 18, for example, is mounted on the component-connection pads 16 via the bonding material 30, as illustrated in FIG. 11B. For example, the component-connection pads 16 are formed by a pair of mutually separated rectangular pads, to match shapes of terminals of the decoupling capacitor 18 that is mounted in the cavity 11*y*. The 2 mutually separated rectangular pads forming the component-connection pads 16 are electrically connected to a power supply pad and a grounding pad, respectively, through via wirings 17 penetrating the board 11E. The power supply pad and the grounding pad form a part of the socket-connection pads 22. The power supply pad and the grounding pad are electrically connected, respectively, to a power supply terminal and a ground terminal that are provided in the socket 90. Otherwise, the circuit board module 1E illustrated in FIGS. 11A and 11B is the same as the circuit board module 1 of the first embodiment illustrated in FIGS. 1A, 1B, 2A, and 2B.

According to the circuit board module 1E, the cavity 11*y* is provided at the position where the circuit board 10E and the terminal board 20 overlap in the plan view illustrated in FIG. 11A. In addition, the decoupling capacitor 18 is mounted in the cavity 11*y*, so that the decoupling capacitor 18 may be arranged at a position close to the power pad forming a part of the socket-connection pads 22. As a result, it is possible to reduce noise from a power supply provided on the side of the socket 90. Of course, an electronic component other than the decoupling capacitor 18 may be mounted in the cavity 11*y*. Otherwise, effects obtainable by the third embodiment are the same as those obtainable by the first embodiment.

Modification of Third Embodiment

In a modification of the third embodiment, the cavity for mounting the component is provided in the circuit board at a position different from that of the third embodiment. In the modification of the third embodiment, those parts that are the same as those corresponding parts of the embodiments and modifications described above are designated by the same reference numerals, and a repeated description of the same parts may be omitted.

Figure 12:
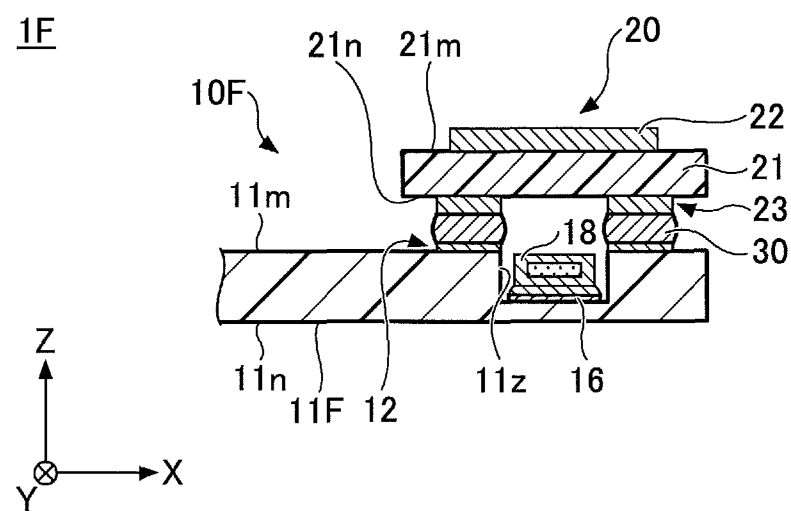
FIG. 12 is a cross sectional view illustrating an example of the circuit board module in a modification of the third embodiment.

FIG. 12 is a cross sectional view illustrating an example of the circuit board module in the modification of the third embodiment. The cross sectional view illustrated in FIG. 12 corresponds to the cross sectional view along the line C-C in FIG. 11A.

As illustrated in FIG. 12, a circuit board module 1F includes a circuit board 10F, and a terminal board 20. The circuit board 10F differs from the circuit board 10E illustrated in FIGS. 11A and 11B, in that the circuit board 10F uses a board 11F in place of the board 11E.

In the circuit board 10F, a cavity 11*z* extends from the surface 11*m* towards the surface 11*n* of the board 11F by a predetermined depth as illustrated in FIG. 12, in contrast to the cavity 11*y* illustrated in FIG. 11B that extends from the surface 11*n* towards the surface 11*m*. The cavity 11*z* is defined by inner sidewalls of the board 11F, and an inner surface of the board 11F forming a bottom part of the cavity 11*z*. The cavity 11*z* is formed in a region where the board 11F and the terminal board 20 overlap in the plan view. The cavity 11*z* is used for mounting the component therein. For this reason, the shape of the cavity 11*z* in the plan view, and the depth of the cavity 11*z*, may be appropriately determined according to the shape and size of the component that is to be mounted in the cavity 11*z*, similarly as in the case of the cavity 11*y*.

Similarly as in the case of the cavity 11*y* illustrated in FIG. 11B, component-connection pads 16 are provided at the bottom part of the cavity 11*z*, and a decoupling capacitor 18, for example, is mounted on the component-connection pads 16 via the bonding material 30, as illustrated in FIG. 12. For example, the component-connection pads 16 are formed by a pair of mutually separated rectangular pads, to match shapes of terminals of the decoupling capacitor 18 that is mounted in the cavity 11*z*. The 2 mutually separated rectangular pads forming the component-connection pads 16 are electrically connected to a power supply pad and a grounding pad, respectively, through wirings (not illustrated). The power supply pad and the grounding pad form a part of the socket-connection pads 22. Otherwise, the circuit board module 1F illustrated in FIG. 12 is the same as the circuit board module 1E of the third embodiment illustrated in FIGS. 11A and 11B.

According to the circuit board module 1F, the cavity 11*z* is provided at the position where the circuit board 10F and the terminal board 20 overlap in a plan view. In addition, the decoupling capacitor 18 is mounted in the cavity 11*z*, so that the decoupling capacitor 18 may be arranged at a position close to the power pad forming a part of the socket-connection pads 22. As a result, it is possible to obtain effects similar to the effects obtainable by the third embodiment.

In addition, according to the circuit board module 1F, the decoupling capacitor 18 may be mounted in the cavity 11*z*, simultaneously as when mounting the electronic components on the surface 11*m* of the board 11F, by a reflow process. For this reason, compared to a case in which the decoupling capacitor 18 is mounted in the cavity 11*y* or the decoupling capacitor 18 is mounted on the terminal board 20, it is possible to reduce the number of reflow processes associated with all of the electronic components to be mounted in the circuit board module 1F. As a result, it is possible to reduce risks of failure of the electronic components mounted in the circuit board module 1F.

In the case in which the cavity 11*z* is provided, it may no longer be possible to provide a part of the pads 121 in the center pad column 121L of the board-connection pads 12, and a part of the pads 231 in the center pad column 231L of the board-connection pads 23. But in this case, the self-alignment function can still be exhibited to a satisfactory extent by other pads 121 in the center pad column 121L of the board-connection pads 12, and other pads 231 in the center pad column 231L of the board-connection pads 23.

According to the embodiments and modifications described above, it is possible to provide a circuit board module which can improve the positional accuracy and the degree of parallelism of the terminal board with respect to the circuit board.

Although the embodiments are numbered with, for example, "first," "second," "third," the ordinal numbers do not imply priorities of the embodiments. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

For example, each of the pads is not limited to the approximately rectangular shape, and other shapes, such as circular and polygonal shapes may be used for each of the pads. In addition, the circuit board and the terminal board are not limited to those of the embodiments and modifications described above, and may be formed by inorganic boards, flexible boards, or the like.

What is claimed is:

1. A circuit board module that is electrically connectable to a socket by inserting one end part thereof into the socket, and extractable from the socket, the circuit board module comprising:

a circuit board having a surface mounted with an electronic component; and a terminal board having a first surface provided with a column of socket-connection pads, and mounted on the surface of the circuit board at the one end part, wherein the terminal board includes a first pad column, a second pad column, and a third pad column respectively provided on a second surface of the terminal board opposite to the first surface, wherein the first pad column includes a plurality of first pads arranged at predetermined intervals in a first direction, the second pad column includes a plurality of second pads, equal to a number of first pads, arranged at the predetermined intervals in the first direction, and the third pad column includes a plurality of third pads, equal to the number of first pads, arranged at the predetermined intervals in the first direction, wherein the second pad column and the third pad column are arranged on both sides of the first pad column along a second direction perpendicular to the first direction, separated from the first pad column, to be line symmetrical to a centerline of the first pad column that is parallel to the first direction, wherein each first pad has an area larger than an area of each second pad and an area of each third pad, wherein, among adjacent first, second, and third pads along the second direction, centerlines of the second pad and the third pad along the second direction match a centerline of the first pad along the second direction, wherein the circuit board includes a fourth pad column of fourth pads, a fifth pad column of fifth pads, and a sixth pad column of sixth pads respectively provided on the surface of the circuit board opposing the second surface of the terminal board, at positions opposing the first pad column, the second pad column, and the third pad column of the terminal board, respectively, and wherein mutually opposing pads of the first pad column and the fourth pad column, the second pad column and the fifth pad column, and the third pad column and the sixth pad column are respectively bonded by a bonding material.

2. The circuit board module as claimed in claim 1, wherein a total area of the adjacent first, second, and third pads along the second direction is larger than an area of one of the socket-connection pads of the column of socket-connection pads.

3. The circuit board module as claimed in claim 1, wherein an outer periphery of the terminal board, opposing an inner wall of the socket when the circuit board module is inserted into the socket, projects more towards an outside in an inserting direction of the circuit board module with respect to the socket than an outer periphery of the circuit board, opposing the inner wall of the socket when the circuit board module is inserted into the socket, at the one end part of the circuit board module.

4. The circuit board module as claimed in claim 1, wherein the terminal board has an approximate rectangular shape in a plan view of the terminal board viewed in a direction perpendicular to the first surface of the terminal board, and an oblique cutout is provided at two corners of the terminal board at the one end part of the circuit board module.

5. The circuit board module as claimed in claim 1, wherein the terminal board has an approximate rectangular shape in a plan view of the terminal board viewed in a direction perpendicular to the first surface of the terminal board, and an oblique cutout is provided at each of four corners of the terminal board.

6. The circuit board module as claimed in claim 1, wherein the circuit board includes a projecting region that projects in an inserting direction of the circuit board module with respect to the socket in a plan view of the circuit board viewed in a direction perpendicular to the surface of the circuit board, and the terminal board is mounted on the surface of the circuit board in the projecting region of the circuit board.

7. The circuit board module as claimed in claim 6, wherein the terminal board has an approximate rectangular shape in a plan view of the terminal board viewed in a direction perpendicular to the first surface of the terminal board, and a chamfered or rounded part is provided at two corners of the terminal board at the one end part of the circuit board module.

8. The circuit board module as claimed in claim 1, wherein the terminal board has an approximate rectangular shape in a plan view of the terminal board viewed in a direction perpendicular to the first surface of the terminal board, and a chamfered or rounded part is provided at two corners of the terminal board at the one end part of the circuit board module.

9. The circuit board module as claimed in claim 1, wherein the circuit board includes a cavity, configured, to receive the electronic component, provided in a region where the circuit board and the terminal board overlap in a plan view of the terminal board viewed in a direction perpendicular to the first surface of the terminal board.

* * * * *